United States Patent
Choi et al.

(10) Patent No.: US 9,705,492 B2
(45) Date of Patent: Jul. 11, 2017

(54) SWITCH CIRCUIT AND SPDT SWITCH CIRCUIT

(71) Applicant: Samsung Electro-Mechanics Co., Ltd., Suwon (KR)

(72) Inventors: Jae Hyouck Choi, Sungnam (KR); Sung Hwan Park, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 755 days.

(21) Appl. No.: 14/140,035

(22) Filed: Dec. 24, 2013

(65) Prior Publication Data

US 2014/0175901 A1    Jun. 26, 2014

(30) Foreign Application Priority Data

Dec. 26, 2012 (KR) .................... 10-2012-0153374

(51) Int. Cl.
*H03K 17/00* (2006.01)
*H03K 17/693* (2006.01)

(52) U.S. Cl.
CPC ........ *H03K 17/693* (2013.01); *Y10T 307/747* (2015.04)

(58) Field of Classification Search
CPC .................. H03K 17/693; Y10T 307/747
USPC .................. 327/365, 378, 339, 434
See application file for complete search history.

(56) References Cited

U.S. PATENT DOCUMENTS

| | | | | |
|---|---|---|---|---|
| 4,602,209 A * | 7/1986 | Williams | ............. | H03K 17/732 323/289 |
| 5,138,177 A * | 8/1992 | Morgan | ............... | H03K 17/163 250/551 |
| 5,151,762 A * | 9/1992 | Uenishi | ............... | H01L 29/7455 257/133 |
| 5,227,655 A * | 7/1993 | Kayama | ............. | H01L 27/0688 257/327 |
| 5,341,004 A * | 8/1994 | Furuhata | ............. | H01L 27/0716 257/138 |
| 5,506,539 A * | 4/1996 | Kelly | ................. | H03K 17/0822 327/379 |
| 5,559,656 A * | 9/1996 | Chokhawala | ....... | H01L 27/0248 361/111 |
| 6,380,644 B1 * | 4/2002 | Iliasevitch | ....... | H03K 17/04123 307/130 |
| 7,659,770 B2 * | 2/2010 | Teraguchi | ............ | H03K 17/005 327/427 |

(Continued)

FOREIGN PATENT DOCUMENTS

| JP | 2005-515657 | 5/2005 |
|---|---|---|
| JP | 2008-17416 A | 1/2008 |

OTHER PUBLICATIONS

Korean Office Action issued on Oct. 19, 2016 in counterpart Korean Application No. 10-2012-0153374. (13 pages with English translation).

*Primary Examiner* — Viet Q Nguyen (74) *Attorney, Agent, or Firm* — NSIP Law (57) ABSTRACT

The present invention relates to a switch circuit and a single pole double throw (SPDT) circuit. The switch circuit includes: a MOS transistor transferring or blocking a signal according to a turn on/off operation thereof; a gate resistor connected to a gate of the MOS transistor; and a variable gate resistor circuit increasing a resistance value of the gate resistor when the MOS transistor is changed from a turn-off state to a turn-on state.

4 Claims, 7 Drawing Sheets

(56) References Cited

U.S. PATENT DOCUMENTS

| | | | | |
|---|---|---|---|---|
| 7,679,417 | B2* | 3/2010 | Vice | H03H 11/245 327/308 |
| 7,848,712 | B2* | 12/2010 | Fu | H03K 17/145 333/100 |
| 7,928,794 | B2* | 4/2011 | Balboni | H03K 17/04106 327/389 |
| 8,103,221 | B2* | 1/2012 | Ta | H01P 1/15 333/101 |
| 8,451,044 | B2* | 5/2013 | Nisbet | H03K 17/687 327/308 |
| 8,482,336 | B2* | 7/2013 | Sun | H01L 21/823878 327/434 |
| 8,493,128 | B2* | 7/2013 | Adamski | H03K 17/693 327/365 |
| 8,638,451 | B2* | 1/2014 | Melkis | G06F 3/0325 356/614 |
| 8,922,268 | B2* | 12/2014 | Madan | H03K 17/162 327/427 |
| 9,484,908 | B1* | 11/2016 | Lu | H03K 17/133 |
| 2001/0040479 | A1* | 11/2001 | Zhang | H03K 17/687 327/427 |
| 2003/0063482 | A1* | 4/2003 | Carsten | H02M 1/08 363/89 |
| 2004/0129980 | A1* | 7/2004 | Shiratake | H01L 29/8605 257/363 |
| 2007/0257861 | A1* | 11/2007 | Zhang | H05B 33/0818 345/46 |
| 2008/0258799 | A1* | 10/2008 | Teraguchi | H03K 17/005 327/427 |
| 2011/0260774 | A1* | 10/2011 | Granger-Jones | H03K 17/102 327/427 |
| 2012/0057387 | A1* | 3/2012 | Lai | H02M 7/797 363/132 |
| 2013/0307750 | A1* | 11/2013 | Kim | H01Q 1/50 343/876 |
| 2015/0326207 | A1* | 11/2015 | Yu | H03K 17/10 343/745 |
| 2016/0329891 | A1* | 11/2016 | Bakalski | H03K 17/693 |

\* cited by examiner

SWITCH CIRCUIT AND SPDT SWITCH CIRCUIT

CROSS REFERENCE(S) TO RELATED APPLICATIONS

This application claims the benefit under 35 U.S.C. Section 119 of Korean Patent Application Serial No. 10-2012-0153374, entitled "Switch Circuit and SPDT Circuit" filed on Dec. 26, 2012, which is hereby incorporated by reference in its entirety into this application.

BACKGROUND OF THE INVENTION

1. Technical Field

The present invention relates to a switch circuit and a single pole double throw (SPDT) circuit, and more particularly, to a switch circuit and an SPDT circuit capable of improving insertion loss characteristics by varying a resistance value of a gate resistor of a metal oxide semiconductor (MOS) transistor.

2. Description of the Related Art

In accordance with the development of a wireless communication technology, 4G mobile communication such as long term evolution (LTE) in addition to the 3G mobile communication has emerged. As a function of the 4G mobile communication network has been added to existing 2G and 3G mobile communication networks, a frequency band that should be supported by one cellular phone has gradually increased.

In order for one cellular phone to cover a wide frequency band, a single pole multi throw (SPMT) switch using a metal oxide semiconductor field effect transistor (MOSFET) has been used.

In this case, insertion loss characteristics of the switch should be excellent in order to decrease loss of a system, and isolation characteristics of the switch should be excellent for stability of the system.

A general flow of a signal passing through a switch using the MOSFET will be described below. A gate resistor Rg of the MOSFET serves to suppress signals leaked through a gate. Therefore, as a resistance value of the gate resistor becomes large, the leakage of the signals is decreased, such that many signals are transferred to an output. As a result, insertion loss is decreased.

However, when the resistance value of the gate resistor is large, a switching time is increased to cause a problem in a system operation. Therefore, as the gate resistor, a resistor having a large value may not be unconditionally used. Here, the switching time may be represented by the product of gate resistance and gate capacitance. Therefore, a magnitude of the resistance value of the gate resistor is limited by the switching time. In this case, generally, a fixed gate resistor is used, and a magnitude of a resistance value is determined to satisfy the switching time of the MOSFET.

RELATED ART DOCUMENT

Patent Document (Patent Document 1) Japanese Patent Laid-Open Publication No. 2005-515657 (laid-open published on May 26, 2005)

SUMMARY OF THE INVENTION

An object of the present invention is to provide a switch circuit and a single pole double throw (SPDT) switch capable of improving insertion loss characteristics by varying a resistance value of a gate resistor of a metal oxide semiconductor (MOS) transistor.

That is, an object of the present invention is to improve insertion loss characteristics by allowing resistance values of gate resistors in each of the case in which an MOS transistor is turned on and the case in which the MOS transistor is turned off to be different from each other by using the fact that switching times in each of the cases are different from each other.

According to an exemplary embodiment of the present invention, there is provided a switch circuit including: a MOS transistor transferring or blocking a signal according to a turn on/off operation thereof; a gate resistor connected to a gate of the MOS transistor; and a variable gate resistor circuit increasing a resistance value of the gate resistor when the MOS transistor is changed from a turn-off state to a turn-on state.

The variable gate resistor circuit may include a series additional resistor and a first transistor turned on at the time of applying turn-on gate power of the MOS transistor to connect the series additional resistor in series with the gate resistor, thereby increasing the resistance value of the gate resistor.

The variable gate resistor circuit may further include a second transistor connected in parallel with the first transistor and turned on at the time of applying turn-off gate power of the MOS transistor to turn off the MOS transistor.

Each of the MOS transistor, the first transistor, and the second transistor may be an N-channel MOS (NMOS) transistor. Each of the MOS transistor and the first transistor may be an NMOS transistor, and the second transistor may be a P-channel MOS (PMOS) transistor.

The MOS transistor may form a signal transfer switch of a single pole double throw (SPDT) circuit.

According to another exemplary embodiment of the present invention, there is provided a switch circuit including: an MOS transistor transferring or blocking a signal according to a turn on/off operation thereof; a gate resistor connected to a gate of the MOS transistor; and a variable gate resistor circuit decreasing a resistance value of the gate resistor when the MOS transistor is changed from a turn-on state to a turn-off state.

The variable gate resistor circuit may include: a parallel additional resistor connected in parallel with the gate resistor; and third and fourth transistors turned on at the time of applying turn-off gate power of the MOS transistor to connect the gate resistor and the parallel additional resistor in parallel with each other, thereby decreasing the resistance value of the gate resistor and turning off the MOS transistor.

The variable gate resistor circuit may further include a fifth transistor turned on at the time of applying turn-on gate power of the MOS transistor to turn on the MOS transistor through the gate resistor.

Each of the MOS transistor, the third transistor, the fourth transistor, and the fifth transistor may be an NMOS transistor. Each of the MOS transistor and the fifth transistor may be an NMOS transistor, and each of the third and fourth transistors may be a PMOS transistor.

The MOS transistor may form a signal transfer switch of an SPDT circuit.

According to still another exemplary embodiment of the present invention, there is provided an SPDT circuit including: an antenna; a first MOS transistor group transmitting a transmission signal from a transmitting end to the antenna according to a turn-on operation thereof and blocking introduction of a reception signal received in the antenna into the transmitting end according to a turn-off operation thereof; a first gate resistor group including gate resistors each connected to gates of the respective transistors of the first MOS transistor group; a second MOS transistor group applied with gate power complementary to turn-on gate power of the first MOS transistor group to operate complementarily to the first MOS transistor group, transferring the reception signal to a receiving end, and blocking leakage of the transmission signal to the receiving end; a second gate resistor group including gate resistors each connected to gates of the respective transistors of the second MOS transistor group; and a variable gate resistor circuit group increasing resistance values of the respective gate resistors when each of the first and second MOS transistor groups is changed from a turn-off state to a turn-on state.

The variable gate resistor circuit group may include a first variable gate resistor circuit increasing resistance values of the respective gate resistors when the first MOS transistor group is changed from a turn-off state to a turn-on state; and a second variable gate resistor circuit increasing resistance values of the respective gate resistors when the second MOS transistor group is changed from a turn-off state to a turn-on state. The first variable gate resistor circuit may include a first series additional resistor; a first transistor turned on at the time of applying turn-on gate power of the first MOS transistor group to connect the first series additional resistor in series with the respective gate resistors of the first MOS transistor group, thereby increasing the resistances value of the gate resistors; and a second transistor connected in parallel with the first transistor and turned on at the time of applying turn-off gate power of the first MOS transistor group to turn off the first MOS transistor group. The second variable gate resistor circuit may include a second series additional resistor; an eleventh transistor turned on at the time of applying turn-on gate power of the second MOS transistor group to connect the second series additional resistor in series with the respective gate resistors of the second MOS transistor group, thereby increasing the resistances value of the gate resistors; and a twelfth transistor connected in parallel with the eleventh transistor and turned on at the time of applying turn-off gate power of the second MOS transistor group to turn off the second MOS transistor group.

In each of the first and second MOS transistor groups, NMOS transistors may be connected to one another in a cascode structure, and each of the first, second, eleventh, and twelfth transistors may be an NMOS transistor. In each of the first and second MOS transistor groups, NMOS transistors may be connected to one another in a cascode structure, each of the first and eleventh transistors may be an NMOS transistor, and each of the second and twelfth transistors may be a PMOS transistor.

According to still another exemplary embodiment of the present invention, there is provided an SPDT circuit including: an antenna; a first MOS transistor group transmitting a transmission signal from a transmitting end to the antenna according to a turn-on operation thereof and blocking introduction of a reception signal received in the antenna into the transmitting end according to a turn-off operation thereof; a first gate resistor group including gate resistors each connected to gates of the respective transistors of the first MOS transistor group; a second MOS transistor group applied with gate power complementary to turn-on gate power of the first MOS transistor group to operate complementarily to the first MOS transistor group, transferring the reception signal to a receiving end, and blocking leakage of the transmission signal to the receiving end; a second gate resistor group including gate resistors each connected to gates of the respective transistors of the second MOS transistor group; and a variable gate resistor circuit group decreasing resistance values of the respective gate resistors when each of the first and second MOS transistor groups is changed from a turn-on state to a turn-off state.

The variable gate resistor circuit group may include a third variable gate resistor circuit decreasing the resistance values of the respective gate resistors when the first MOS transistor group is changed from a turn-on state to a turn-off state; and a fourth variable gate resistor circuit decreasing the resistance values of the respective gate resistors when the second MOS transistor group is changed from a turn-on state to a turn-off state. The third variable gate resistor circuit may include a third parallel additional resistor group including parallel additional resistors connected in parallel with the respective gate resistors of the first MOS transistor group; third and fourth transistors turned on at the time of applying turn-off gate power of the first MOS transistor group to connect the respective gate resistors and the respective parallel additional resistors of the third parallel additional resistor group in parallel with each other, thereby decreasing the resistance values of the respective gate resistors and turning off the first MOS transistor group; and a fifth transistor turned on at the time of applying turn-on gate power of the first MOS transistor group to turn on the first MOS transistor group through the respective gate resistors. The fourth variable gate resistor circuit may include a fourth parallel additional resistor group including parallel additional resistors connected in parallel with the respective gate resistors of the second MOS transistor group; thirteenth and fourteenth transistors turned on at the time of applying turn-off gate power of the second MOS transistor group to connect the respective gate resistors and the respective parallel additional resistors of the fourth parallel additional resistor group in parallel with each other, thereby decreasing the resistance values of the respective gate resistors and turning off the second MOS transistor group; and a fifteenth transistor turned on at the time of applying turn-on gate power of the second MOS transistor group to turn on the second MOS transistor group through the respective gate resistors.

In each of the first and second MOS transistor group, NMOS transistors may be connected to one another in a cascode structure, and each of the third, fourth, fifth, thirteenth, fourteenth, and fifteenth transistors may be an NMOS transistor. In each of the first and second MOS transistor group, NMOS transistors may be connected to one another in a cascode structure, each of the third, fourth, thirteenth, and fourteenth transistors may be a PMOS transistor, and each of the fifth and fifteenth transistors may be an NMOS transistor.

DESCRIPTION OF THE PREFERRED EMBODIMENTS

Exemplary embodiments of the present invention for accomplishing the above-mentioned objects will be described with reference to the accompanying drawings. In the description, the same reference numerals will be used to describe the same components of which a detailed description will be omitted in order to allow those skilled in the art to understand the present invention.

In the specification, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

Although a singular form is used in the present description, it may include a plural form as long as it is opposite to the concept of the present invention and is not contradictory in view of interpretation or is used as a clearly different meaning. It should be understood that "include", "have", "comprise", "be configured to include", and the like, used in the present description do not exclude presence or addition of one or more other characteristic, component, or a combination thereof.

The accompanying drawings referred in the present description may be examples for describing exemplary embodiments of the present invention. In the accompanying drawings, a shape, a size, a thickness, and the like, may be exaggerated in order to effectively describe technical characteristics.

First, a switch circuit according to a first exemplary embodiment of the present invention will be described in detail with reference to the accompanying drawings. In the specification, the same reference numerals will be used in order to describe the same components throughout the accompanying drawings.

Figure 1:
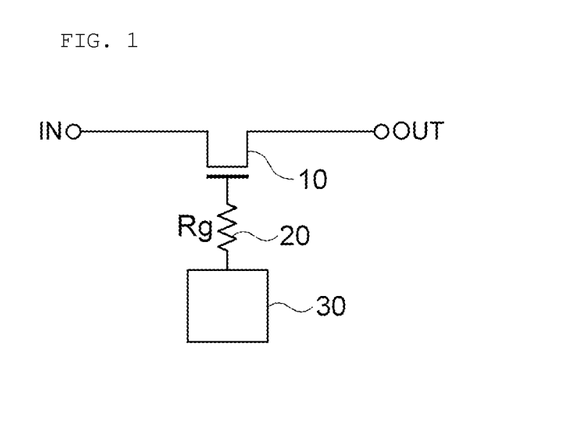
FIG. 1 is a view schematically showing a switch circuit according to an exemplary embodiment of the present invention.
Figure 2A:
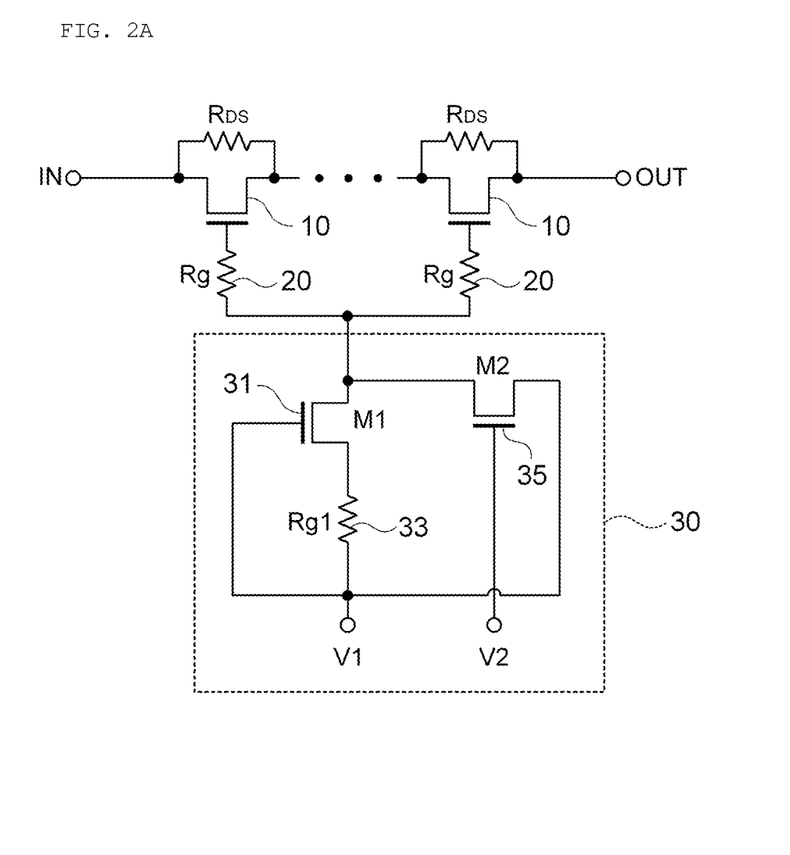
FIGS. 2A and 2B are views schematically showing a switch circuit according to another exemplary embodiment of the present invention.
Figure 2B:
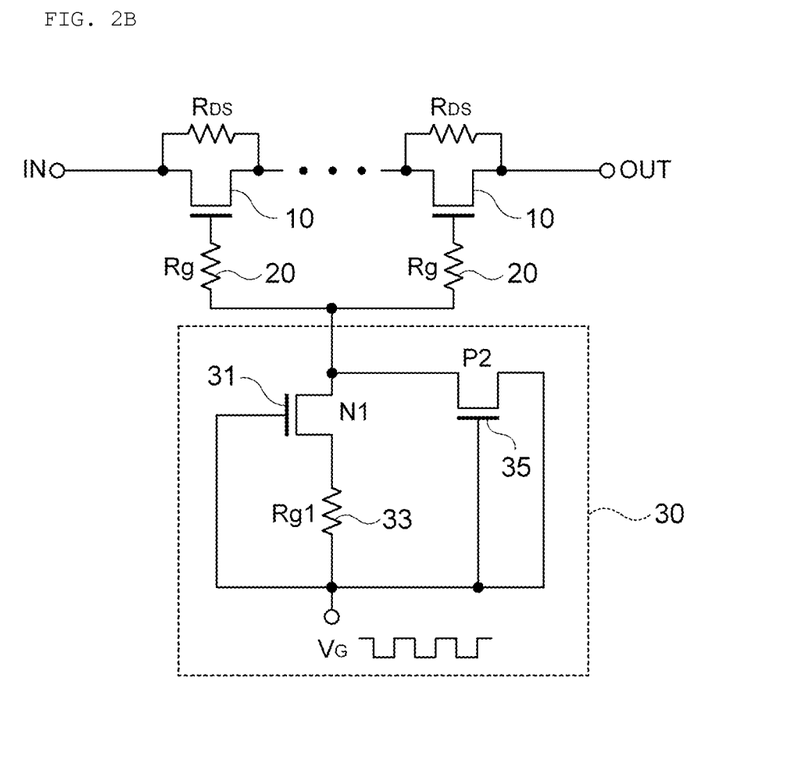
Figure 3:
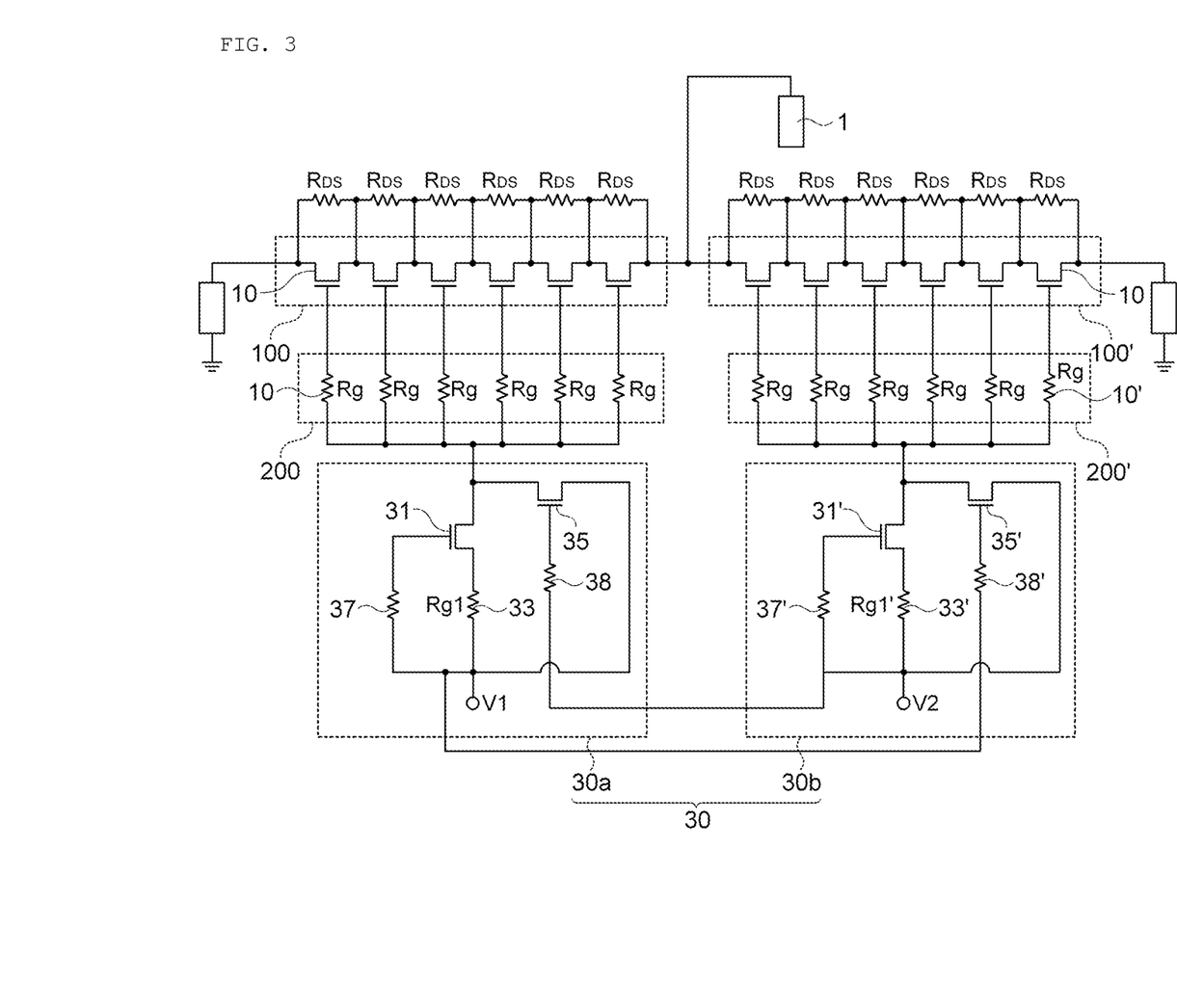
FIG. 3 is a view schematically showing a single pole double throw (SPDT) circuit according to still another exemplary embodiment of the present invention.

FIG. 1 is a view schematically showing a switch circuit according to an exemplary embodiment of the present invention; FIGS. 2A and 2B are views schematically showing a switch circuit according to another exemplary embodiment of the present invention; and FIG. 3 is a view schematically showing a single pole double throw (SPDT) circuit according to still another exemplary embodiment of the present invention.

Referring to FIGS. 1, 2A, and/or 2B, the switch circuit according to the exemplary embodiment of the present invention is configured to include a metal oxide semiconductor (MOS) transistor 10, a gate resistor 20, and a variable gate resistor circuit 30. The switch circuit according to the exemplary embodiment of the present invention will be described with reference to FIGS. 1, 2A, and/or 2B.

The MOS transistor 10 transfers or blocks a signal according to a turn on/off operation thereof. For example, the MOS transistor (MOSFET) 10 is a signal transmission switch. For example, as shown in FIG. 3, the MOS transistor 10 may form a signal transfer switch of an SPDT circuit.

For example, the MOS transistor 10 may be an N-channel MOS transistor, but is not limited thereto.

Referring to FIGS. 1, 2A, and/or 2B, the gate resistor Rg 20 is connected to a gate of the MOS transistor 10.

Generally, a switching time when the MOSFET switch is changed from a turn-on state to a turn-off state is longer than a switching time in which it is changed from a turn-off state to a turn-on state. As an actual measurement result of a switching time of a general MOSFET switch, the switching time (T off) when the MOSFET switch is changed from the turn-on state to the turn-off state was 4.8 µs and the switching time (T on) in which it is changed from the turn-off state to the turn-on state was 0.4 µs. As a result, a difference of about twelve times was generated between these two switching times. In the general MOSFET switch, since the switching time when the MOSFET switch is changed from the turn-on state to the turn-off state is long, a resistance value of the gate resistor Rg 20 has been determined so as to satisfy the switching time when the MOSFET is changed from the turn-on state to the turn-off state.

In the present embodiment, since the switching time when the MOSFET switch is changed from the turn-off state to the turn-on state is short, the gate resistor Rg when the MOSFET switch is changed from the turn-off state to the turn-on state is allowed to have a resistance value larger than that of the gate resistor Rg when the MOSFET switch is changed from the turn-on state to the turn-off state to decrease leakage of the signal, thereby making it possible to improve insertion loss characteristics. To this end, in the present embodiment, the following variable gate resistor circuit 30 is configured, thereby improving the insertion loss characteristics.

Next, the variable gate resistor circuit 30 will be described with reference to FIGS. 1, 2A, and 2B. The variable gate resistor circuit 30 increases the resistance value of the gate resistor when the MOS transistor 10 is changed from the turn-off state to the turn-on state. In the present embodiment, the gate resistor Rg when the MOSFET switch is changed from the turn-off state to the turn-on state is allowed to have a resistance value larger than that of the gate resistor Rg when the MOSFET switch is changed from the turn-on state to the turn-off state to decrease the leakage of the signal, thereby making it possible to improve insertion loss characteristics.

For example, referring to FIGS. 2A and 2B, in one example, the variable gate resistor circuit 30 may include a series additional resistor 33 and a first transistor 31. In addition, referring to FIGS. 2A and 2B, in one example, the variable gate resistor circuit 30 may further include a second transistor 35.

In FIGS. 2A and 2B, the first transistor 31 is turned on at the time of applying turn-on gate power of the MOS transistor 10 to connect the series additional resistor 33 in series with the gate resistor 20, thereby increasing the resistance value of the gate resistor. For example, each of the MOS transistor 10 and the first transistor 31 may be an NMOS transistor.

In addition, referring to FIGS. 2A and 2B, in one example, the variable gate resistor circuit 30 may further include a second transistor 35. Here, the second transistor 35 is connected in parallel with the first transistor 31 and is turned on at the time of applying turn-off gate power of the MOS transistor 10 to turn off the MOS transistor 10. In FIGS. 2A and 2B, when the second transistor 35 is turned on, the MOS transistor 10 is turned off, such that a voltage charged in the gate of the MOS transistor 10 is discharged through the gate resistor Rg 20 and the second transistor 35.

For example, although not shown in FIGS. 2A and 2B, referring to FIG. 3, the first and second transistors 31 and 35 may include gate resistors 37 and 38, respectively.

For example, referring to FIG. 2A, in one example, each of the MOS transistor 10, the first transistor 31, and the second transistor 35 may be an NMOS transistor. In this case, gate applied voltages V1 and V2 have complementary power values. For example, in FIG. 2A, when V1 is a high signal and V2 is a low signal, the first transistor M1 31 is turned on and the second transistor M2 35 is turned off, such that the MOS transistor 10 is changed from the turn-off state to the turn-on state. In this case, a resistance value of the series additional resistor Rg' 33 is added, such that the resistance value of the gate resistor 20 is increased. In addition, when V1 is a low signal and V2 is a high signal, the first transistor M1 31 is turned off and the second transistor M2 35 is turned on, such that the MOS transistor 10 is changed from the turn-on state to the turn-off state. In this case, the resistance value of the series additional resistor 33 is not added, such that the resistance value of the gate resistor 20 is not changed.

Alternatively, referring to FIG. 2B, in one example, each of the MOS transistor 10 and the first transistor 31 may be an NMOS transistor, and the second transistor 35 may be a P-channel MOS (PMOS) transistor. In the case in which the second transistor 35 is the PMOS transistor, when the second transistor 35 is turned on, the MOS transistor 10 is turned off, such that the voltage charged in the gate of the MOS transistor 10 may be discharged through the gate resistor Rg 20 and the second transistor 35. In this case, a gate applied voltage $V_G$ may be a signal in which high signals and low signals are alternately repeated.

More specifically, for example, in FIG. 2B, when the gate applied voltage $V_G$ is applied as a high signal, the first transistor N1 31, which is the NMOS transistor, is turned on and the second transistor P2 35, which is the PMOS transistor, is turned off, such that the MOS transistor 10 is changed from the turn-off state to the turn-on state. In this case, the resistance value of the series additional resistor Rg' 33 is added, such that the resistance value of the gate resistor 20 is increased. In addition, when the gate applied voltage $V_G$ is applied as a low signal, the first transistor N1 31, which is the NMOS transistor, is turned off and the second transistor P2 35, which is the PMOS transistor, is turned on, such that the MOS transistor 10 is changed from the turn-on state to the turn-off state. In this case, the resistance value of the series additional resistor 33 is not added, such that the resistance value of the gate resistor 20 is not changed.

Next, a switch circuit according to a second exemplary embodiment of the present invention will be described in detail with reference to the accompanying drawings. In this case, the switch circuit according to the first exemplary embodiment of the present invention described above and FIG. 3 will be referred. Therefore, an overlapped description will be omitted.

Figure 4:
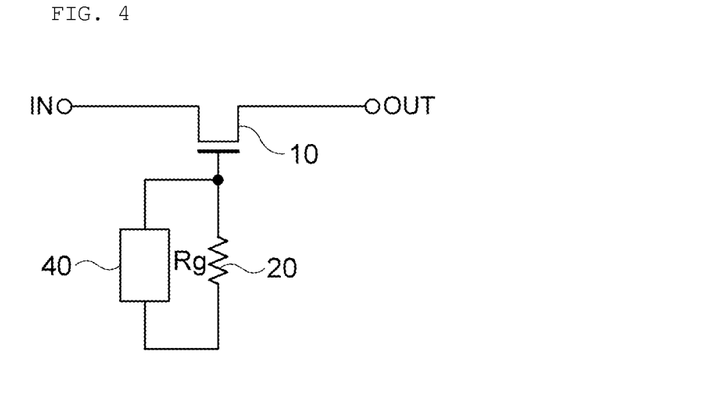
FIG. 4 is a view schematically showing a switch circuit according to still another exemplary embodiment of the present invention.
Figure 5A:
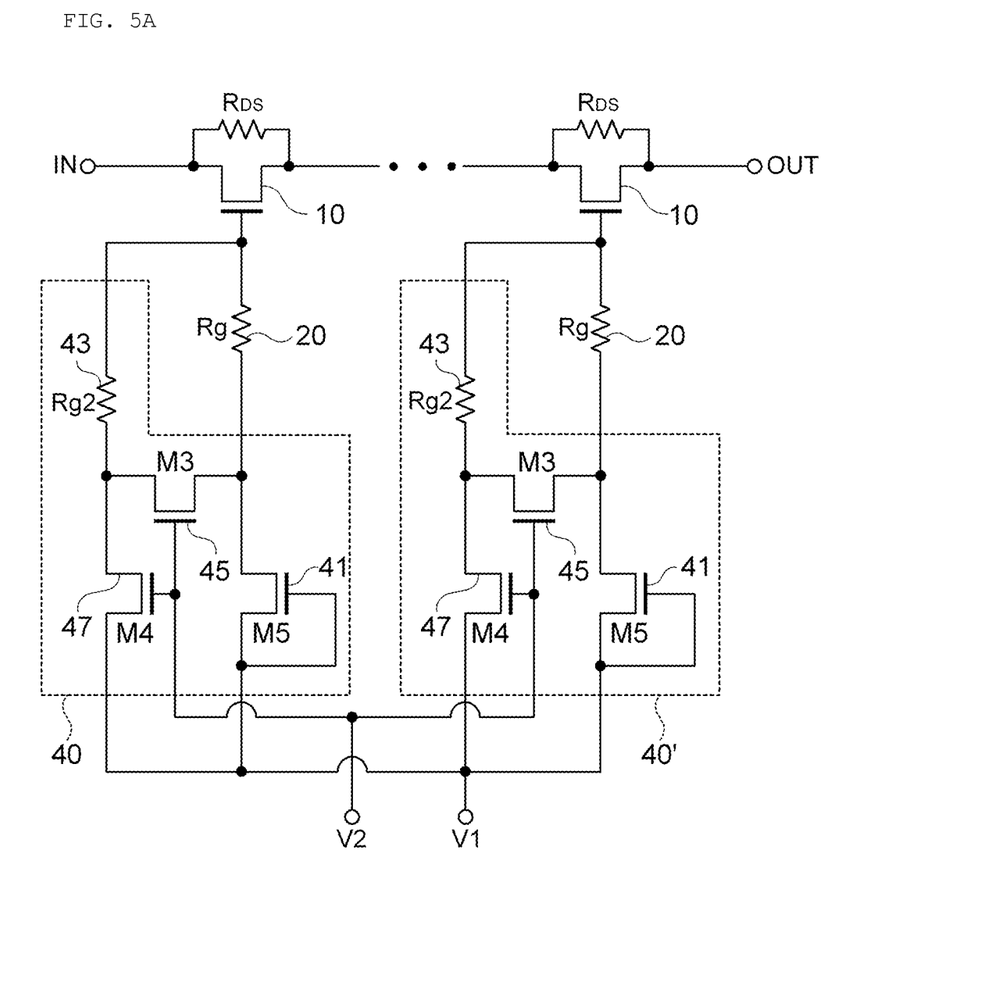
FIGS. 5A and 5B are views schematically showing a switch circuit according to still another exemplary embodiment of the present invention.
Figure 5B:
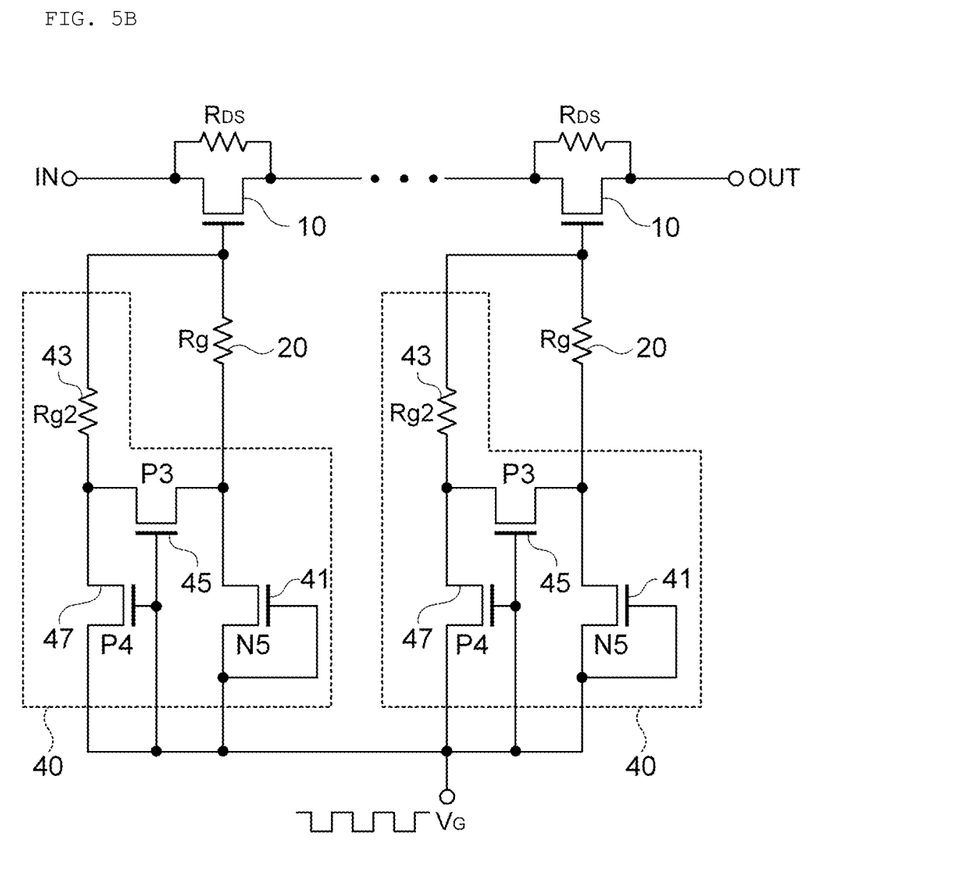

FIG. 4 is a view schematically showing a switch circuit according to still another exemplary embodiment of the present invention; and FIGS. 5A and 5B are views schematically showing a switch circuit according to still another exemplary embodiment of the present invention.

Referring to FIGS. 4, 5A, and 5B, the switch circuit according to the second exemplary embodiment of the present invention is configured to include an MOS transistor 10, a gate resistor 20, and a variable gate resistor circuit 40, similar to the switch circuit according to the first exemplary embodiment of the present invention described above. Here, the MOS transistor 10 transfers or blocks a signal according to a turn on/off operation thereof. In addition, the gate transistor 20 is connected to a gate of the MOS transistor.

Although not shown, in the case in which a structure of FIGS. 5A and 5B is applied to the SPDT switch structure of FIG. 3, the MOS transistor 10 may form a signal transfer switch of the SPDT circuit.

In addition, referring to FIGS. 4, 5A, and 5B, in the present embodiment, the variable gate resistor circuit 40 decreases a resistance value of the gate resistor when the MOS transistor 10 is changed from a turn-on state to a turn-off state, unlike the first exemplary embodiment of the present invention.

That is, since a switching time when the MOS transistor is changed from the turn-on state to the turn-off state is long and a switching time when the MOS transistor is changed from the turn-off state to the turn-on state is short, in the present embodiment, the gate resistor Rg when the MOS transistor is changed from the turn-on state to the turn-off state is allowed to have a resistance value smaller than that of the gate resistor Rg when the MOS transistor is changed from the turn-off state to the turn-on state to decrease leakage of the signal, thereby making it possible to improve insertion loss characteristics. To this end, the variable gate resistor circuit 40 is configured so as to be different from that of the first exemplary embodiment of the present invention described above, thereby improving the insertion loss characteristics.

Referring to FIGS. 5A and 5B, in one example, the variable gate resistor circuit 40 may include a parallel additional resistor 43 and third and fourth transistors 45 and 47. In addition, referring to FIGS. 5A and 5B, the variable gate resistor circuit 40 may further include a fifth transistor 41.

Referring to FIGS. 5A and 5B, the parallel additional resistor 43 is connected in parallel with the gate resistor 20 of the MOS transistor 10.

The third and fourth transistors 45 and 47 may be turned on at the time of applying turn-off gate power of the MOS transistor 10 to connect the gate resistor 20 and the parallel additional resistor 43 in parallel with each other, thereby decreasing the resistance value of the gate resistor and turning off the MOS transistor 10. Here, the third transistor 45 is a transistor connecting the gate resistor 20 and the parallel additional resistor 43 in parallel with each other. For example, M3 shown in FIG. 5A and P3 shown in FIG. 5B correspond to the third transistor 45. In addition, the fourth transistor 47 is connected between the parallel additional resistor 43 and a gate power applying terminal. For example, M4 shown in FIG. 5A and P4 shown in FIG. 5B correspond to the fourth transistor 47. Although the case in which the third transistor 45 is disposed between a node between the parallel additional resistor 43 and the fourth transistor 47 and the gate resistor 20 is shown in FIGS. 5A and 5B, the third transistor 45 may also be disposed between a node between the fourth transistor 47 and the gate power applying terminal directly connected to the parallel additional resistor 43 and the gate resistor 20.

In addition, referring to FIGS. 5A and 5B, in one example, the variable gate resistor circuit 40 may further include a fifth transistor 41. Here, the fifth transistor 41 is turned on at the time of applying turn-on gate power of the MOS transistor 10 to turn on the MOS transistor 10 through the gate resistor 20.

For example, although not shown in FIGS. 5A and 5B, referring to FIG. 3, each of the third transistor 45, the fourth transistor 47, and the fifth transistor 41 may include a gate resistor, similar to the first and second transistors 31 and 35 of FIG. 3.

For example, referring to FIG. 5A, in one example, each of the MOS transistor 10, the third transistor 45, the fourth transistor 47, and the fifth transistor 41 may be an NMOS transistor. In this case, gate applied voltages V1 and V2 have complementary power values. For example, in FIG. 5A, when V1 is a low signal and V2 is a high signal, the fifth transistor M5 41 is turned off and the third and fourth transistors M3 and M4 45 and 47 are turned on, such that the MOS transistor 10 is changed from the turn-on state to the turn-off state. In this case, the parallel additional resistor Rg' 43 and the gate resistor 20 are connected in parallel with each other, such that the resistance value of the gate resistor is decreased. In addition, when V1 is a high signal and V2 is a low signal, the fifth transistor M5 41 is turned on and the third and fourth transistors M3 and M4 45 and 47 are turned off, such that the MOS transistor 10 is changed from the turn-off state to the turn-on state. In this case, the resistance value of the parallel additional resistor 43 is not added, such that the resistance value of the gate resistor 20 is not changed.

Alternatively, referring to FIG. 5B, in one example, each of the MOS transistor 10 and the fifth transistor 41' may be an NMOS transistor, and each of the third and fourth transistors 45' and 47' may be a PMOS transistor. In this case, a gate applied voltage $V_G$ may be a signal in which high signals and low signals are alternately repeated. For example, in FIG. 5B, when the gate applied voltage $V_G$ is applied as a low signal, the fifth transistor N5 41, which is the NMOS transistor, is turned off and the third and fourth transistors P3 and P4 45 and 47, which are the PMOS transistors, are turned on, such that the MOS transistor 10 is changed from the turn-on state to the turn-off state. In this case, the parallel additional resistor Rg' 43 is connected in parallel with the gate resistor 20, such that the resistance value of the gate resistor is decreased. In addition, when the gate applied voltage $V_G$ is applied as a high signal, the fifth transistor N5 41, which is the NMOS transistor, is turned on and the third and fourth transistors P3 and P4 45' and 47', which are the PMOS transistor, are turned off, such that the MOS transistor 10 is changed from the turn-off state to the turn-on state. In this case, the resistance value of the parallel additional resistor 43' is not added, such that the resistance value of the gate resistor 20 is not changed.

Next, an SPDT circuit according to a third exemplary embodiment of the present invention will be described in detail with reference to the accompanying drawings. In this case, the switch circuit according to the first exemplary embodiment of the present invention described above and FIGS. 1, 2A and 2B will be referred. Therefore, an overlapped description will be omitted.

Figure 7:
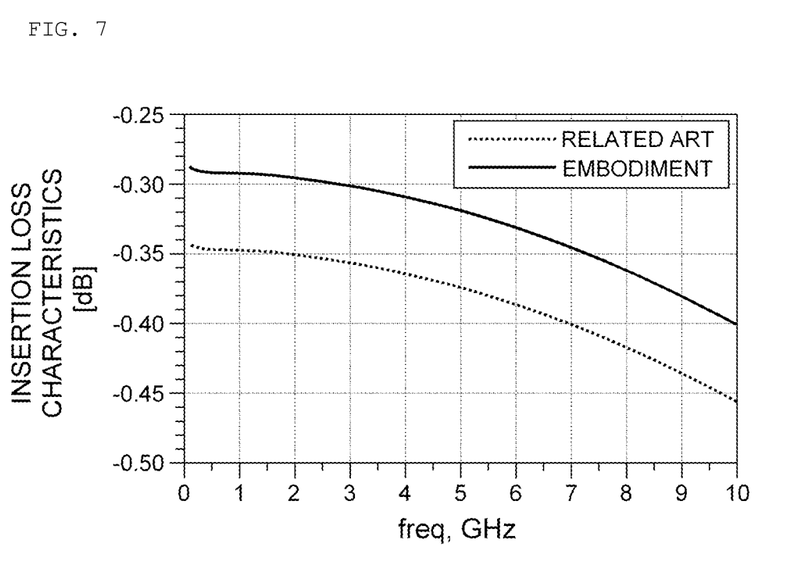
FIG. 7 is a graph schematically showing insertion loss characteristics of the SPDT circuit of FIG. 3 and of a circuit according to the related art.

FIG. 3 is a view schematically showing an SPDT circuit according to still another exemplary embodiment of the present invention; and FIG. 7 is a graph schematically showing insertion loss characteristics of the SPDT circuit of FIG. 3 and a circuit according to the related art.

Referring to FIG. 3, an SPDT circuit according to a third exemplary embodiment of the present invention is configured to include an antenna 1, a first MOS transistor group 100, a first gate resistor group 200, a second MOS transistor group 100', a second gate resistor group 200', and a variable gate resistor circuit group 30.

First, the first MOS transistor group 100 transmits a transmission signal from a transmitting end to the antenna 1 according to a turn-on operation thereof and blocks introduction of a reception signal received in the antenna 1 into the transmitting end according to a turn-off operation thereof.

The first gate resistor group 200 includes gate resistors 20 each connected to gates of the respective transistors 10 of the first MOS transistor group 100.

Next, the second MOS transistor group 100' is applied with gate power complementary to turn-on gate power of the first MOS transistor group 100 to operate complementarily to the first MOS transistor group 100, transfers the reception signal to a receiving end, and blocks leakage of the transmission signal to the receiving end.

The second gate resistor group 200' includes gate resistors 20' each connected to gates of the respective transistors 10 of the second MOS transistor group 100'.

In addition, referring to FIG. 3, the variable gate resistor circuit group 30 increases resistance values of the respective gate resistors when each of the first and second MOS transistor groups 100 and 100' is changed from a turn-off state to a turn-on state.

The SPDT circuit according to still another exemplary embodiment of the present invention will be described in more detail with reference to FIG. 3.

In one example, the variable gate resistor circuit group 30 may include a first variable gate resistor circuit 30a and a second variable gate resistor circuit 30b. Here, the first variable gate resistor circuit 30a increases the resistance values of the respective gate resistors when the first MOS transistor group 100 is changed from a turn-off state to a turn-on state. In addition, the second variable gate resistor circuit 30b increases the resistance values of the respective gate resistors when the second MOS transistor group 100' is changed from a turn-off state to a turn-on state.

A detailed example will be described with reference to FIG. 3. Referring to FIG. 3, the first variable gate resistor circuit 30a may include a first series additional resistor 33, a first transistor 31, and a second transistor 35. The first series additional resistor 33 is connected in series with the respective gate resistors 20 of the first MOS transistor group 100. Here, the respective gate resistors 20 of the first MOS transistor group 100 are connected in parallel with one another.

The first transistor 31 is turned on at the time of applying turn-on gate power of the first MOS transistor group 100 to connect the first series additional resistor 33 in series with the respective gate resistors 20 of the first MOS transistor group 100, thereby increasing the resistances value of the gate resistors.

The second transistor 35 is connected in parallel with the first transistor 31. Here, the second transistor 35 is turned on at the time of applying turn-off gate power of the first MOS transistor group 100 to turn off the first MOS transistor group 100.

For example, the first and second transistors 31 and 35 may include gate resistors 37 and 38, respectively.

In addition, referring to FIG. 3, the second variable gate resistor circuit 30b may include a second series additional resistor 33', an eleventh transistor 31', and a twelfth transistor 35'. Here, the second series additional resistor 33' is connected in series with the respective gate resistors 20 of the second MOS transistor group 100'. The eleventh transistor 31' is turned on at the time of applying turn-on gate power of the second MOS transistor group 100' to connect the second series additional resistor 33' in series with the respective gate resistors 20 of the second MOS transistor group 100', thereby increasing the resistance values of the gate resistors. In addition, the twelfth transistor 35' is connected in parallel with the eleventh transistor 31' and is turned on at the time of applying turn-off gate power of the second MOS transistor group 100' to turn off the second MOS transistor group 100'.

Further, referring to FIG. 3, in each of the first and second transistor groups 100 and 100', NMOS transistors are connected to one another in a cascode structure. In addition, each of the first, second, eleventh, and twelfth transistors 31, 35, 31' and 35' may be an NMOS transistor. In this case, gate applied voltages V1 and V2 have complementary power values.

Alternatively, although not shown, referring to FIG. 2B, each of the first and eleventh transistors 31 and 31' may be an NMOS transistor, and each of the second and twelfth transistors 35 and 35' may be a PMOS transistor. In addition, although not shown, referring to FIG. 2B, a signal in which high signals and low signals are alternately repeated is applied as a gate applied voltage $V_G$ to the first, second, eleventh, and twelfth transistors 31, 35, 31', and 35'.

FIG. 7 shows a result of insertion loss characteristics according to the SPDT circuit shown in FIG. 3. It could be confirmed in FIG. 7 that the insertion loss characteristics was improved in the SPDT circuit shown in FIG. 3 as compared with the SPDT circuit according to the related art that does not include the variable gate resistor circuit 30 by about 20%.

Next, an SPDT circuit according to a fourth exemplary embodiment of the present invention will be described in detail with reference to the accompanying drawings. In this case, the switch circuit according to the second exemplary embodiment of the present invention described above, the SPDT circuit according to the third exemplary embodiment of the present invention described above, and FIGS. 3, 4, 5A, and 5B will be referred. Therefore, an overlapped description will be omitted.

Figure 6:
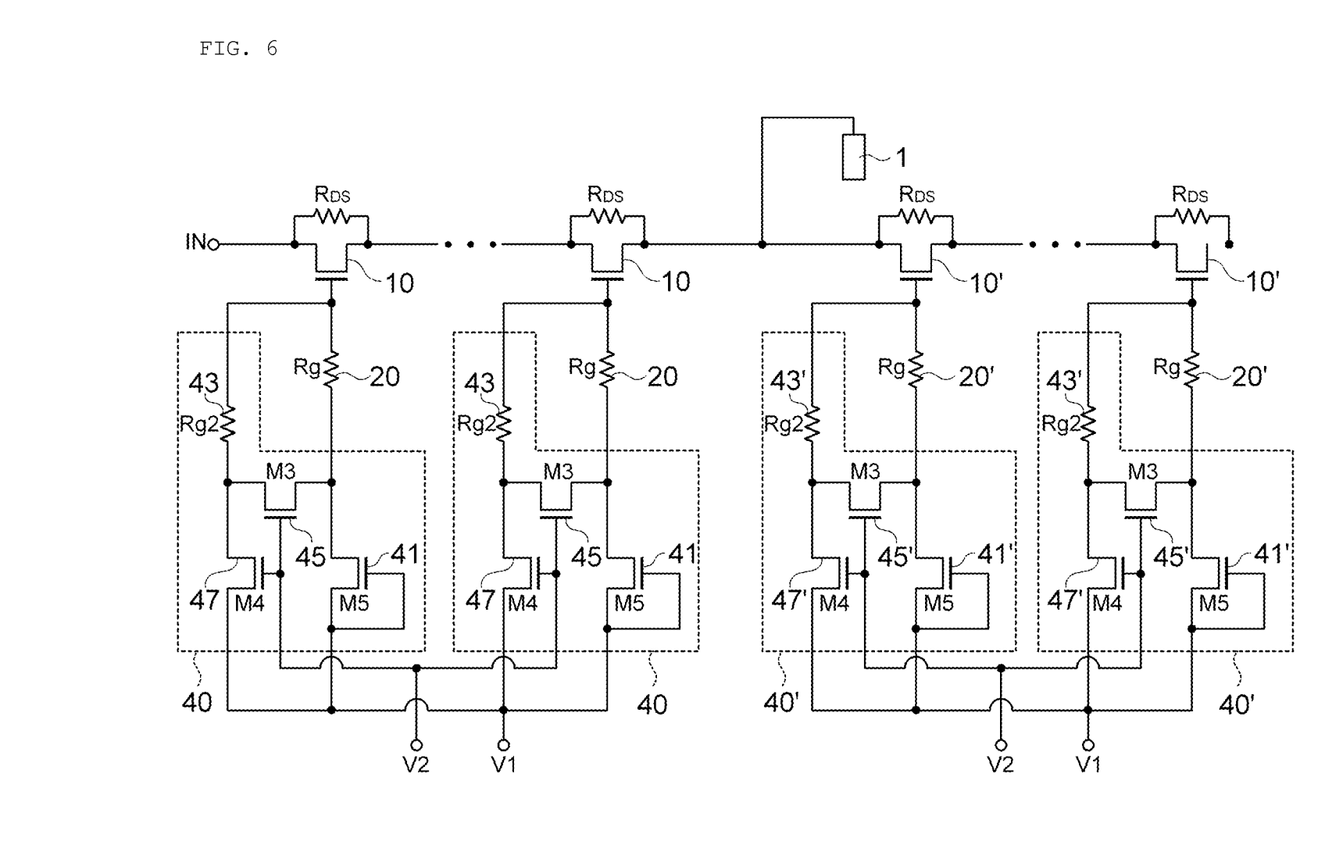
FIG. 6 is a view schematically showing an SPDT circuit according to still another exemplary embodiment of the present invention.

FIG. 6 is a view schematically showing a single pole double throw (SPDT) circuit according to still another exemplary embodiment of the present invention.

Referring to FIG. 6, an SPDT circuit according to a fourth exemplary embodiment of the present invention is configured to include an antenna 1, a first MOS transistor group, a first gate resistor group, a second MOS transistor group, a second gate resistor group, and a variable gate resistor circuit group.

First, the first MOS transistor group transmits a transmission signal from a transmitting end to the antenna 1 according to a turn-on operation thereof and blocks introduction of a reception signal received in the antenna 1 into the transmitting end according to a turn-off operation thereof. The first gate resistor group includes gate resistors 20 each connected to gates of the respective transistors 10 of the first MOS transistor group.

Next, the second MOS transistor group is applied with gate power complementary to turn-on gate power of the first MOS transistor group to operate complementarily to the first MOS transistor group, transfers the reception signal to a receiving end, and blocks leakage of the transmission signal to the receiving end. The second gate resistor group includes gate resistors 20' each connected to gates of the respective transistors 10' of the second MOS transistor group.

In addition, the variable gate resistor circuit group decreases resistance values of the respective gate resistors when each of the first and second MOS transistor groups is changed from a turn-on state to a turn-off state, unlike the third exemplary embodiment of the present invention.

Referring to FIG. 6, in one example, the variable gate resistor circuit group may include a third variable gate resistor circuit 40 and a fourth variable gate resistor circuit 40'. Here, the third variable gate resistor circuit 40 decreases the resistance values of the respective gate resistors when the first MOS transistor group is changed from a turn-on state to a turn-off state. In addition, the fourth variable gate resistor circuit 40' decreases the resistance values of the respective gate resistors when the second MOS transistor group is changed from a turn-on state to a turn-off state.

Referring to FIG. 6, the third variable gate resistor circuit 40 may include a third parallel additional resistor group, third and fourth transistors 45 and 47, and a fifth transistor 41.

The third parallel additional resistor group includes parallel additional resistors 43 connected in parallel with the respective gate resistors 20 of the first MOS transistor group. In addition, the third and fourth transistors 45 and 47 are turned on at the time of applying turn-off gate power of the first MOS transistor group to connect the respective gate resistors 20 and the respective parallel additional resistors 43 of the third parallel additional resistor group in parallel with each other, thereby decreasing the resistance values of the respective gate resistors and turning off the first MOS transistor group. In addition, the fifth transistor 41 is turned on at the time of applying turn-on gate power of the first MOS transistor group to turn on the first MOS transistor group 100 through the respective gate resistors 20.

Referring to FIG. 6, the fourth variable gate resistor circuit 40' may include a fourth parallel additional resistor group, thirteenth and fourteenth transistors 45' and 47', and a fifteenth transistor 41'. Here, the fourth parallel additional resistor group includes parallel additional resistors 43' connected in parallel with the respective gate resistors 20' of the second MOS transistor group. The thirteenth and fourteenth transistors 45' and 47' are turned on at the time of applying turn-off gate power of the second MOS transistor group to connect the respective gate resistors 20' and the respective parallel additional resistors 43' of the fourth parallel additional resistor group in parallel with each other, thereby decreasing the resistance values of the respective gate resistors and turning off the second MOS transistor group. In addition, the fifteenth transistor 41' is turned on at the time of applying turn-on gate power of the second MOS transistor group to turn on the second MOS transistor group through the respective gate resistors 20'.

In addition, referring to FIG. 6, in each of the first and second MOS transistor group, NMOS transistors may be connected to one another in a cascode structure, and each of the third, fourth, fifth, thirteenth, fourteenth, and fifteenth transistors 45, 47, 41, 45', 47', and 41' may be an NMOS transistor.

Alternatively, although not shown, in the case in which a structure of FIG. 5B is applied to the SPDT structure of FIG. 6, in each of the first and second MOS transistor groups, NMOS transistors may be connected to one another in a cascode structure, each of the third, fourth, thirteenth, and fourteenth transistors may be a PMOS transistor, and each of the fifth and fifteenth transistors may be an NMOS transistor.

According to the exemplary embodiments of the present invention, the resistance value of the gate resistor of the MOS transistor is varied, thereby making it possible to improve the insertion loss characteristics.

That is, the fact that switching times in each of the case in which the MOS transistor is turned on and the case in which the MOS transistor is turned off are different from each other is used to allow the resistance values of the gate resistors to be different from each other in each of the cases, thereby making it possible to improve the insertion loss characteristics.

It is obvious that various effects directly stated according to various exemplary embodiments of the present invention may be derived by those skilled in the art from various configurations according to the exemplary embodiments of the present invention.

The accompanying drawings and the above-mentioned exemplary embodiments have been illustratively provided in order to assist in understanding of those skilled in the art to which the present invention pertains rather than limiting a scope of the present invention. In addition, exemplary embodiments according to a combination of the above-mentioned configurations may be obviously implemented by those skilled in the art. Therefore, various exemplary embodiments of the present invention may be implemented in modified forms without departing from an essential feature of the present invention. In addition, a scope of the present invention should be interpreted according to claims and includes various modifications, alterations, and equivalences made by those skilled in the art.

What is claimed is:

1. An SPDT circuit comprising:
   an antenna;
   a first MOS transistor group transmitting a transmission signal from a transmitting end to the antenna according to a turn-on operation thereof and blocking introduction of a reception signal received in the antenna into the transmitting end according to a turn-off operation thereof;
   a first gate resistor group including gate resistors each connected to gates of the respective transistors of the first MOS transistor group;
   a second MOS transistor group applied with gate power complementary to turn-on gate power of the first MOS transistor group to operate complementarily to the first MOS transistor group, transferring the reception signal to a receiving end, and blocking leakage of the transmission signal to the receiving end;
   a second gate resistor group including gate resistors each connected to gates of the respective transistors of the second MOS transistor group; and
   a variable gate resistor circuit group increasing resistance values of the respective gate resistors when each of the first and second MOS transistor groups is changed from a turn-off state to a turn-on state.

2. The SPDT circuit according to claim 1, wherein the variable gate resistor circuit group includes a first variable gate resistor circuit increasing the resistance values of the respective gate resistors when the first MOS transistor group is changed from a turn-off state to a turn-on state; and a second variable gate resistor circuit increasing the resistance values of the respective gate resistors when the second MOS transistor group is changed from a turn-off state to a turn-on state,
   the first variable gate resistor circuit including a first series additional resistor; a first transistor turned on at the time of applying turn-on gate power of the first MOS transistor group to connect the first series additional resistor in series with the respective gate resistors of the first MOS transistor group, thereby increasing the resistances value of the gate resistors; and a second transistor connected in parallel with the first transistor and turned on at the time of applying turn-off gate power of the first MOS transistor group to turn off the first MOS transistor group, and
   the second variable gate resistor circuit including a second series additional resistor; an eleventh transistor turned on at the time of applying turn-on gate power of the second MOS transistor group to connect the second series additional resistor in series with the respective gate resistors of the second MOS transistor group, thereby increasing the resistances value of the gate resistors; and a twelfth transistor connected in parallel with the eleventh transistor and turned on at the time of applying turn-off gate power of the second MOS transistor group to turn off the second MOS transistor group.

3. The SPDT circuit according to claim 2, wherein in each of the first and second MOS transistor groups, NMOS transistors are connected to one another in a cascode structure, and
   each of the first, second, eleventh, and twelfth transistors is an NMOS transistor.

4. The SPDT circuit according to claim 2, wherein in each of the first and second MOS transistor groups, NMOS transistors are connected to one another in a cascode structure,
   each of the first and eleventh transistors is an NMOS transistor, and
   each of the second and twelfth transistors is a PMOS transistor.

* * * * *